United States Patent
Jang

(10) Patent No.: US 9,188,308 B2
(45) Date of Patent: Nov. 17, 2015

(54) LIGHT EMITTING DEVICE PACKAGE AND ILLUMINATION APPARATUS

(71) Applicant: LG INNOTEK CO., LTD., Seoul (KR)

(72) Inventor: Chul Ho Jang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/268,410

(22) Filed: May 2, 2014

(65) Prior Publication Data

US 2014/0328061 A1  Nov. 6, 2014

(30) Foreign Application Priority Data

May 3, 2013  (KR) .................. 10-2013-0049785

(51) Int. Cl.
*F21V 5/04* (2006.01)
*H01L 33/58* (2010.01)
*F21V 5/00* (2015.01)

(52) U.S. Cl.
CPC .............. *F21V 5/045* (2013.01); *F21V 5/007* (2013.01); *H01L 33/58* (2013.01)

(58) Field of Classification Search
USPC ............... 362/311.02, 326, 335, 800, 249.02
See application file for complete search history.

(56) References Cited

U.S. PATENT DOCUMENTS

| 4,915,479 | A  * | 4/1990 | Clarke ........................... 349/62 |
| 7,641,365 | B2 * | 1/2010 | Katzir et al. .................. 362/327 |
| 7,740,375 | B2 * | 6/2010 | Zou et al. ...................... 362/247 |
| 7,832,878 | B2 * | 11/2010 | Brukilacchio et al. .......... 353/99 |
| 7,959,326 | B2 * | 6/2011 | Laporte ................... 362/249.02 |
| 8,071,990 | B2 * | 12/2011 | Bogner et al. ................. 257/98 |
| 2004/0264185 | A1 * | 12/2004 | Grotsch et al. ............... 362/231 |
| 2007/0152230 | A1 | 7/2007 | Duong et al. |
| 2009/0128921 | A1 | 5/2009 | Roth |
| 2009/0129230 | A1 | 5/2009 | Grotsch |
| 2012/0218765 | A1 | 8/2012 | Inoue |
| 2014/0063817 | A1 * | 3/2014 | Bartenbach .............. 362/311.02 |

FOREIGN PATENT DOCUMENTS

WO  WO 2007/107916 A1  9/2007

* cited by examiner

*Primary Examiner* — Laura Tso
(74) *Attorney, Agent, or Firm* — Birch, Stewart, Kolasch & Birch, LLP

(57) ABSTRACT

Embodiments provide a light emitting device package including a body, a light emitting device the body, and a lens disposed on the light emitting device, wherein the lens includes a lower surface portion, an upper surface portion parallel to the lower surface portion, and a lateral surface portion positioned between the lower surface portion and the upper surface portion and provided with a plurality of lateral surfaces, wherein the plurality of lateral surfaces is formed in a shape of a parabola.

20 Claims, 17 Drawing Sheets

FIG.26

| NO | Measurement points | | Required light intensity | Result values |
|---|---|---|---|---|
| | y-axis | x-axis | | |
| 1 | 10U | 5L | ≥ 40 | 206 |
| 2 | 10U | 5R | ≥ 40 | 195 |
| 3 | 5U | 20L | ≥ 25 | 61 |
| 4 | 5U | 10L | ≥ 75 | 195 |
| 5 | 5U | V | ≥ 175 | 238 |
| 6 | 5U | 10R | ≥ 75 | 193 |
| 7 | 5U | 20R | ≥ 25 | 55 |
| 8 | H | 10L | ≥ 100 | 202 |
| 9 | H | 5L | ≥ 200 | 235 |
| 10 | H | V | ≥ 200 | 243 |
| 11 | H | 5R | ≥ 200 | 237 |
| 12 | H | 10R | ≥ 100 | 197 |
| 13 | 5D | 20L | ≥ 25 | 63 |
| 14 | 5D | 10L | ≥ 75 | 191 |
| 15 | 5D | V | ≥ 175 | 237 |
| 16 | 5D | 10R | ≥ 75 | 193 |
| 17 | 5D | 20R | ≥ 25 | 57 |
| 18 | 10D | 5L | ≥ 40 | 199 |
| 19 | 10D | 5R | ≥ 40 | 212 | ately
LIGHT EMITTING DEVICE PACKAGE AND ILLUMINATION APPARATUS

CROSS REFERENCE TO RELATED APPLICATION

This application claims priority to Korean Patent Application 10-2013-0049785, filed in Korea on May 3, 2013 which are hereby incorporated in its entirety by reference as if fully set forth herein.

TECHNICAL FIELD

Embodiments relate to a light emitting device package and light emitting module which may implement a cross-shaped beam pattern.

BACKGROUND

A light emitting device such as a light emitting diode (LED) employing semiconductor materials of elements from Groups III to V or Groups II to VI or a laser diode (LD) may implement various colors such red, green, blue and violet with development of thin film technology and device material. It may also implement highly efficient white light by using a fluorescent material or through color mixing. In addition, compared to the conventional light sources such as a fluorescent lamp and an incandescent lamp, the light emitting device consumes low power and ensures a semi-permanent service life, fast response speed, safety, and eco-friendliness.

A light emitting device package having light emitting devices mounted to the package body and electrically connected is widely used as a light source of a display apparatus.

Particularly, in the case of a chip on board (COB) type light emitting module, light emitting devices, for example, LED chips are directed fixed to a substrate through die bonding and electrically connected through wire bonding. Thereby, the COB type light emitting module is used with light emitting devices arranged on the substrate in the form of an array. A COB type light emitting module generally includes a substrate, LED chips arranged in a line on the substrate, a molding surrounding the LED chips and a lens positioned over the molding.

SUMMARY

Embodiments provide a light emitting device package and a light emitting module which may implement light distribution having a cross-shaped beam pattern.

In one embodiment, a light emitting device package including a body, a light emitting device the body, and a lens disposed on the light emitting device, wherein the lens includes a lower surface portion, an upper surface portion parallel to the lower surface portion, and a lateral surface portion positioned between the lower surface portion and the upper surface portion and provided with a plurality of lateral surfaces, wherein the plurality of lateral surfaces is formed in a shape of a parabola.

An imaginary extension line connecting lateral surfaces of the plurality of lateral surfaces facing each other may have a parabolic shape.

In a cross section of the lens arranged in a vertical direction, a curve corresponding to the lateral surface portion may have a parabolic shape, wherein the vertical direction may be a direction perpendicular to the upper surface portion and the lower surface portion.

The lower surface portion may be positioned in an xy plane in a xyz coordinate system, and a center of the lower surface portion may be positioned at an origin of the xyz coordinate system, wherein a focal length of a parabola of the lateral surface portion may be less than or equal to 5 mm.

A distance between the lower surface portion and the upper surface portion may be greater than or equal to 10 mm and less than or equal to 50 mm.

The upper surface portion may be a polygon including a plurality of first sides, and the lower surface portion may be a polygon including second sides corresponding to the first sides, wherein one of the lateral surfaces may be positioned between a corresponding one of the first sides and a corresponding one of the second sides.

An area of the upper surface portion may be greater than an area of the lower surface portion.

The upper surface portion and the lower surface portion may be quadrangles, the lateral surface portion may include four lateral surfaces, and the light emitted from the lens may have a cross shape.

The lower surface portion of the lens may be positioned in an xy plane, and a center of the lower surface portion may be positioned at an origin, wherein, in a cross section of the lens, a curve corresponding to the lateral surface portion may have a parabolic shape according to Equation 1, and the cross section of the lens may be parallel to a zy plane and passes through the origin.

$$y^2 = 4a(z+a), \qquad \text{Equation 1}$$

wherein a in equation 1 may be a focal length of the parabola, and the focus of the parabola may be positioned at the origin of the zy plane.

The lower surface portion may include a light incidence portion having a semi-spherical shape and receiving incident light from the light emitting devices.

In another embodiment, a light emitting device package includes a body, a light emitting device disposed on the body, and a lens disposed on the light emitting device, wherein the lens includes a lower surface portion, an upper surface portion parallel to the lower surface portion, and a lateral surface portion positioned between the lower surface portion and the upper surface portion, the lateral surface portion including a plurality of lateral surfaces, wherein each of the lateral surfaces has a parabolic shape and has a plurality of regions divided in a column direction, wherein at least one of the regions includes a recess having a predetermined curvature, and the column direction is directed from the upper surface portion to the lower surface portion.

Intervals of the regions included in each of the lateral surfaces have the same width.

An interval of at least one of the regions included in each of the lateral surfaces may have a different width than the intervals of the other regions.

A width of an interval of each of the regions included in each of the lateral surfaces may be less than or equal to 5 mm.

The recess may have a constant curvature from one end of at least one region of the regions to the other end of the at least one region.

The upper surface portion and the lower surface portion are quadrangles, and the lateral surface portion includes four lateral surfaces, wherein each of the lateral surfaces includes a plurality of regions, each of the regions including the recess, wherein the recess may have a constant curvature from one end of each of the regions to the other end of each of the regions.

In another embodiment, an illumination apparatus includes a substrate, a plurality of light emitting devices disposed on the substrate, and a plurality of lenses disposed to correspond to the light emitting devices respectively, wherein each of the lenses includes a lower surface portion, an upper surface portion parallel to the lower surface portion, and a lateral surface portion positioned between the lower surface portion and the upper surface portion and provided with a plurality of lateral surfaces, the plurality of lateral surfaces having a curvature equal to a curvature of a parabola, wherein the lenses are arranged in one line from one end of the substrate to the other end of the substrate, wherein a first angle of at least one of the lenses is different from first angles of the other lenses, the first angle being an inclination angle of a central axis of each of the lenses with respect to a first reference plane perpendicular to an upper surface of the substrate.

The first angle of a first lens disposed in the middle of the lenses may be 0°, and the first angles of the other lenses may increase as a distance from the first lens to left and right sides increases. The lenses positioned on the left side of the first lens and the lenses positioned on the right side of the first lens may be inclined with respect to the first reference plane in opposite directions.

A second angle of at least one of the lenses may be different from second angles of the other lenses, the second angle being an inclination angle of the central axis of each of the lenses with respect to a second reference plane perpendicular to an upper surface of the substrate and the first reference plane.

The second angle of the first lens disposed in the middle of the lenses may be 0°, and the second angles of the other lenses may increase as the distance from the first lens to the left and right sides increases. The lenses positioned on the left side of the first lens and the lenses positioned on the right side of the first lens may be inclined with respect to the second reference plane in opposite directions.

BRIEF DESCRIPTION OF THE DRAWINGS

Arrangements and embodiments may be described in detail with reference to the following drawings in which like reference numerals refer to like elements and wherein:

FIG. 26 is a view showing light intensity values at measurements points of a single light source of a light emitting module including the lens shown in FIG. 14;

DESCRIPTION OF SPECIFIC EMBODIMENTS

Figure 1:
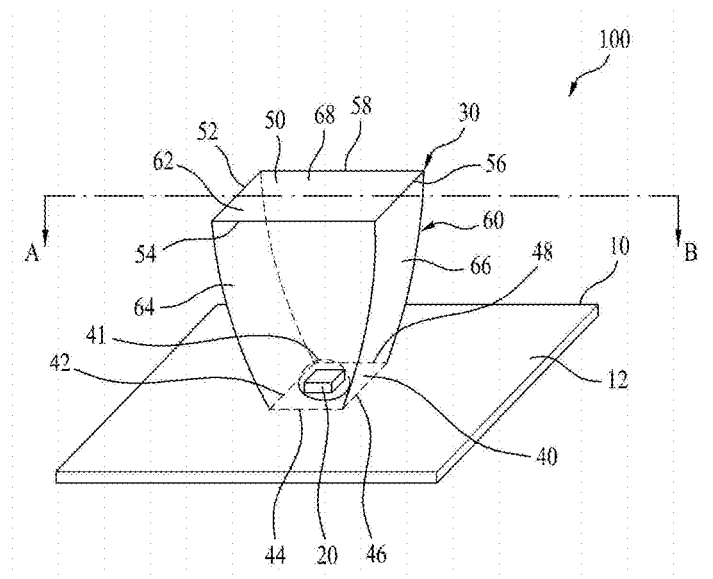
FIG. 1 is a view illustrating a light emitting device package according to an exemplary embodiment.

Hereinafter, embodiments will be described with reference to the annexed drawings. It will be understood that when an element is referred to as being "on" or "under" another element, it can be directly on/under the element or one or more intervening elements may be present. When an element is referred to as being "on" or "under", "under the element" as well as "on the element" can be included based on the element.

It will be appreciated that for simplicity and clarity of illustration, the dimensions of some of the elements are exaggerated, omitted, or schematically shown relative to other elements. In addition, elements shown in the drawings have not necessarily been drawn to scale. Wherever possible, the same reference numbers will be used throughout the drawings to refer to the same or like parts. Hereinafter, a light emitting device package, and a light emitting module according to embodiments will be described with reference to the accompanying drawings.

Figure 2:
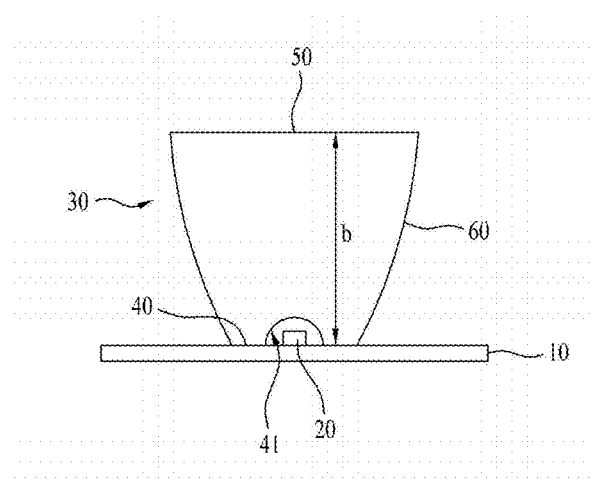
FIG. 2 is a cross-sectional view illustrating the light emitting device package shown in FIG. 1, taken along line AB.

FIG. 1 is a view illustrating a light emitting device package 100 according to an exemplary embodiment, and FIG. 2 is a cross-sectional view illustrating the light emitting device package 100 shown in FIG. 1, taken along line AB.

Referring to FIGS. 1 and 2, the light emitting device package 100 includes a body 10, a light emitting device 20, and a lens 30.

The body 10 may be a substrate having a good insulation property or thermal conductivity such as a silicon-based wafer level package, a silicon substrate, a silicon carbide (SiC) substrate and an aluminum nitride (AlN) substrate, or a substrate formed of a resin material such as polyphthalamide (PPA) having high reflectivity.

Alternatively, the body 10 may include a printed circuit board and has a structure with a stack of a plurality of substrates.

The light emitting device 20 may be disposed on the body 10 and generate light. For example, the light emitting device 20 may be a light emitting diode (LED).

The body 10 may include a first conductive layer (not shown) and second conductive layer (not shown) which are capable of supplying power to the light emitting device 20. The first and second conductive layers may be implanted in various forms such as a circuit pattern or a lead frame.

The lens 30 may be positioned at an upper portion of the light emitting device 20 and may refract and emit light radiated from the light emitting device 20. The lens 30 may be a light-transmissive material. The lens 30 may be formed through injection molding of a possible material such as, for example, resin, polymethylmethacrylate (PMMA), polycarbonate (PC), polyethylene (PE), or silicon.

The lens 30 may include a lower surface portion 40 onto which light from the light emitting device 20 is incident, an upper surface portion 50 parallel with the lower surface portion 40 and spaced apart from the lower surface portion 40, and a lateral surface portion 60 positioned between the lower surface portion 40 and the upper surface portion 50 and having a parabolic curvature.

The lens 30 may be disposed on the substrate 10 to allow the lower surface portion 40 to contact an upper surface 12 of the body 10 and provided with a light incidence portion 41 through which the light generated from the light emitting device 20 enters the lens 30. The lower surface portion 40 may be parallel with the upper surface portion 12 of the body 10.

The light incidence portion 41 may be positioned at a central region of the lower surface portion 40 and provided with a structure recessed from the lower surface portion 40 toward the upper surface portion 50.

For example, the light incidence portion 41 may be formed in the shape of a semi-sphere or dome having a certain diameter to allow light radiated from the light emitting device 20 to be transmitted therethrough while being little refracted. The diameter of the light incidence portion 41 should be less than the length of one side of the lower surface portion 40. For example, since the light incidence portion 41 having a semispherical shape should be positioned within the lower surface portion 40, the diameter of the light incidence portion 41 may be within 10 mm.

The edge of the lower end of the light incidence portion may be circular. However, embodiments are not limited thereto. The edge may have a polygonal shape or an oval shape.

The light emitting device 20 may be positioned in one region of the upper surface 12 of the substrate 10 corresponding to the light incidence portion 41 and spaced apart from the light incidence portion 41. For example, the light incidence portion 41 may surround the light emitting device 20, and an air gap may exist between the light incidence portion 41 and the light emitting device 20. Since air and the lens 30 have different indices of refraction, the light radiated from the light emitting device 20 may be refracted at the interface between the air gap and the lens 30. Thereby, a property of light distribution (e.g., a beam angle) of the light emitting device package 100 may be adjusted.

The upper surface portion 50 may be placed at a position spaced a certain distance b from the lower surface portion 40 and be parallel with the lower surface portion 40. For example, each of the upper surface portion 50 and the lower surface portion 40 is flat.

The upper surface portion 50 may be a polygon including a plurality of first sides. The lower surface portion 40 may be a polygon including a plurality of second sides corresponding to the first sides.

For example, the upper surface portion 50 may be a quadrangular surface having four first sides 52, 54, 56 and 58, and the lower surface portion 40 may be a quadrangular surface having four second sides 42, 44, 46 and 48. The area of the upper surface portion 50 may be greater than that of the lower surface portion 40.

Each of the first sides 52, 54, 56 and 58 may correspond to one of the second sides 42, 44, 46 and 48. Each first side (e.g., 42) and a corresponding second side (e.g., 52) may be parallel to each other.

The lateral surface portion 60 may include a plurality of lateral surfaces 62, 64, 66 and 68. For example, the lateral surface portion 60 may include four lateral surfaces 62, 64, 66 and 68. The lateral surfaces 62, 64, 66 and 68 may connect the first sides 52, 54, 56 and 58 to the second sides 42, 44, 46 and 48. For example, one of the lateral surfaces 62, 64, 66 and 68 may be positioned between the corresponding first and second side 42 and 52, 44 and 54, 46 and 56, or 48 and 58.

The lateral surfaces 62, 64, 66 and 68 may have a parabolic shape. That is, the lateral surfaces 62, 64, 66 and 68 have the same curvature as that of a parabola. In this case, the focus of the parabola may be positioned on the lower surface portion 40.

Two lateral surfaces (e.g., 62 and 66, or 64 and 68) facing each other may have parabolic shapes with the same curvature or the same focal length. An imaginary extension line connecting two lateral surfaces (e.g., 62 and 66, or 64 and 68) facing each other among the lateral surfaces 62, 64, 66 and 68 may have a parabolic shape.

For example, each of the lateral surfaces 62, 64, 66 and 68 may include an upper side, a lower side, and two lateral sides positioned between the upper side and the lower side and facing each other. An imaginary extension line connecting the two lateral sides facing each other may have a parabolic shape.

In a cross section of the lens 30 arranged in a vertical direction, a curve corresponding to the lateral surface portion 60 may have a parabolic shape. The curve corresponding to the lateral surface portion 60 may have the same curvature as that of a parabola. Herein, the vertical direction may be a direction perpendicular to the upper surface portion 50 and the lower surface portion 40. For example, when the upper surface portion 50 and the lower surface portion 40 are parallel to the xy plane, the vertical direction may be parallel to the zy plane or the zx plane.

Figure 3:
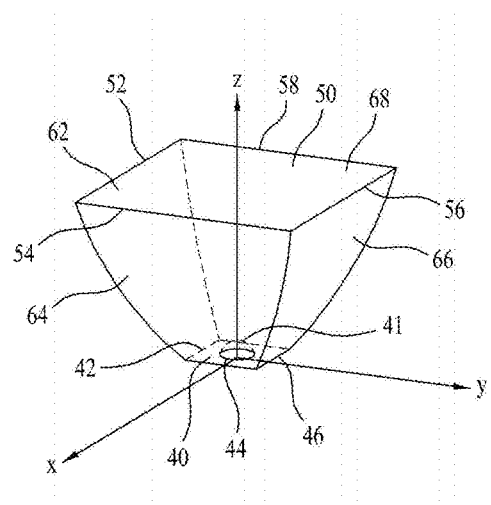
FIG. 3 is a view illustrating the lens of FIG. 1 presented in the xyz coordinate system.
Figure 4:
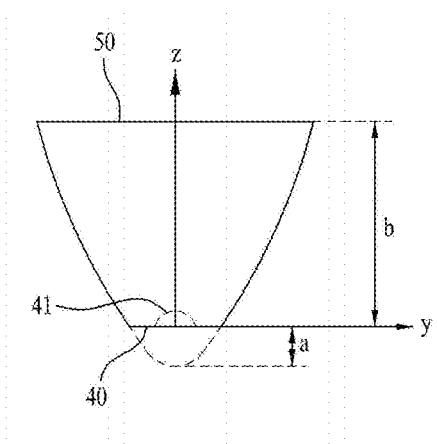
FIG. 4 is a view showing a cross section of the lens of FIG. 3 in the zy plane.

FIG. 3 is a view illustrating the lens 30 of FIG. 1 presented in the xyz coordinate system and FIG. 4 is a view showing a cross section of the lens 20 of FIG. 3 in the zy plane.

Referring to FIGS. 3 and 4, the lower surface portion 40 of the lens 30 may be parallel to the xy plane. The lower surface portion 40 of the lens 30 may be positioned on the xy plane (x,y,0), and the center of the light incidence portion may be positioned at the origin (0,0,0). The light emitting device 20 may be positioned on the body 10 below the light incidence portion 41 such that the center thereof is aligned with the origin (0, 0, 0).

In the cross section of the lens 30 of FIG. 4 which is in or parallel to the zy plane, the curve corresponding to the lateral surface portion 60 may have a curvature of a parabola according to Equation 1.

For example, in the cross section of the lens 30 in the zy plane (0, y, z), the curve corresponding to the lateral surface portion 60 may have a curvature according to Equation.

$$y^2 = 4a(z+a)$$ Equation 1

Herein, a in equation 1 may be a focal length of the parabola according to Equation 1. The focus of the parabola according to Equation 1 may be positioned at the origin (0, 0) of the zy plane.

To allow distribution of the light emitted from the lens 30 to be implemented in a cross-shaped beam pattern (see FIG. 9b), the focal length a needs to be less than or equal to 5 mm (0<a≤5 mm), and the distance b from the lower surface portion 40 to the upper surface portion 50 needs to be greater than or equal to 10 mm and less than or equal to 50 mm (10 mm≤b≤50 mm). If the focal length a and the distance b do not satisfy the above conditions, the cross shape may be distorted or twisted.

Figure 5:
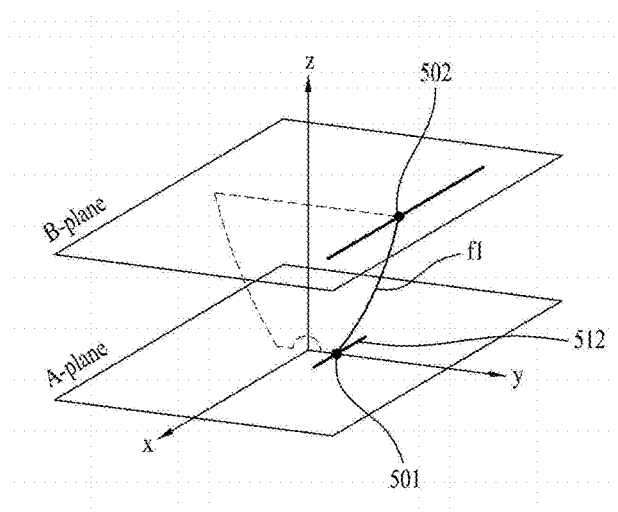
FIGS. 5 to 7 are views illustrating designing the structure of the lens shown in FIG. 1.
Figure 6A:
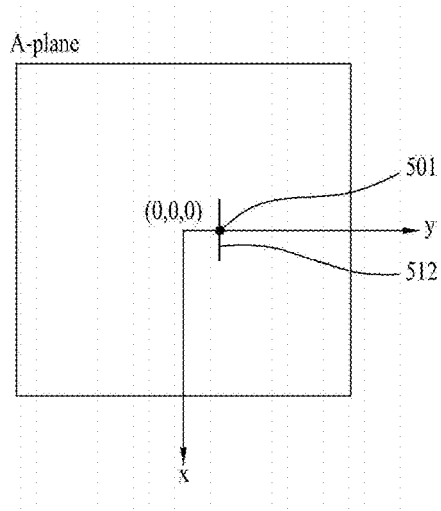
Figure 6B:
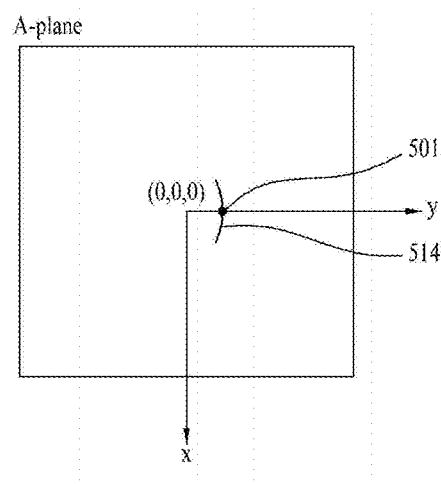
Figure 6C:
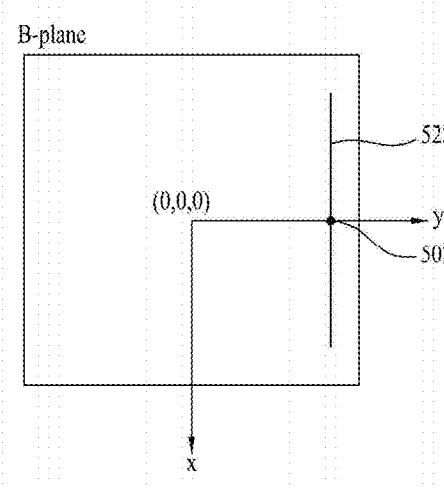
Figure 6D:
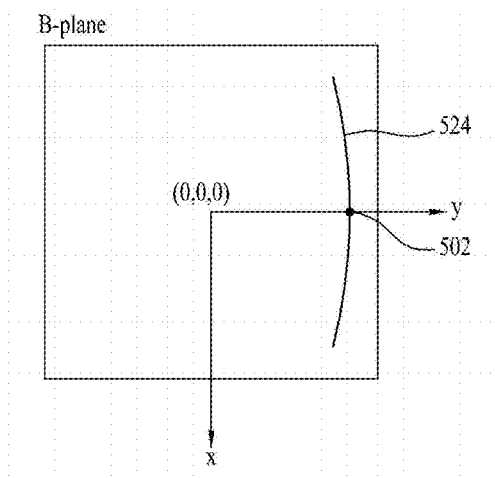
Figure 7:
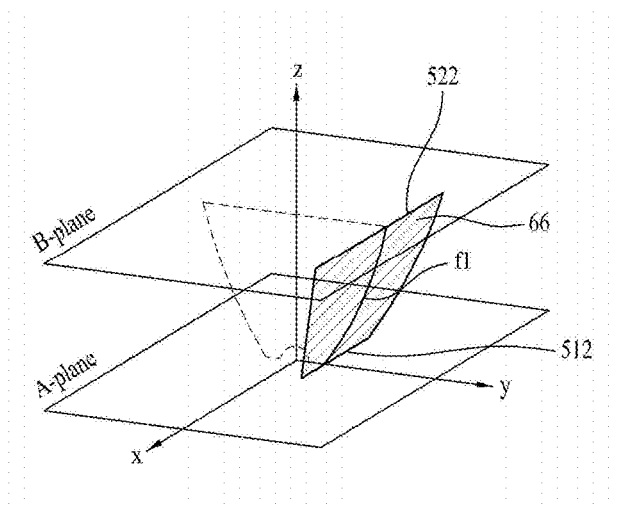

FIGS. 5 to 7 are views illustrating designing the structure of the lens 30 shown in FIG. 1.

Referring to FIG. 5, a parabola f1 according to Equation 1 may be formed in the zy plane.

An A-plane parallel to the xy plane may be formed on the xy plane, and a B-plane intersecting the parabola f1 and parallel to A-plane may be formed at a position spaced a distance b from the A-plane in the z direction.

Referring to FIG. 6A, a first straight line 512 passing through a contact point 501 of the A-plane and the parabola f1 and parallel to the x-axis may be formed in the A-plane. The first straight line 512 may be symmetrical with respect to the y-axis.

In another embodiment as shown in FIG. 6B, a first curve 514 passing through the contact point 501 of the A-plane and the parabola f1 may be formed in the A-plane, in place of the first straight line 512. The first curve 514 may include two or more curves having different curvatures. In addition, the first curve 514 may be symmetrical with respect to the y-axis.

Referring to FIG. 6C, a second straight line 522 passing through a contact point 502 of the B-plane and the parabola f1 and parallel to the x-axis may be formed in the B-plane. The second straight line 522 may be symmetrical with respect to the y-axis. The length of the second straight line 522 may be greater than that of the first straight line 512.

In another embodiment, a second curve 524 passing through the contact point 502 of the B-plane and the parabola f1 may be formed in the B-plane, in place of the second straight line 522, as shown in FIG. 6D. The second curve 524 may include two or more curves having different curvatures. In addition, the second curve 524 may be symmetrical with respect to the y-axis.

Referring to FIG. 7, many other curves having the focus positioned at the origin (0, 0, 0) between the first straight line 512 in the A-plane and the second straight line 522 in the B-plane and having the same curvature as the parabola f1 may be formed. A set of such curves may construct one lateral surface (e.g., 66) of the lateral surface portion 60.

The other lateral surfaces 62, 64 and 68 of the lateral surface portion 60 may also be designed using the method illustrated in FIGS. 5 to 7. In addition, the lower surface portion 40 may be provided with the light incidence portion 41 having a semi-spherical shape.

Figure 8:
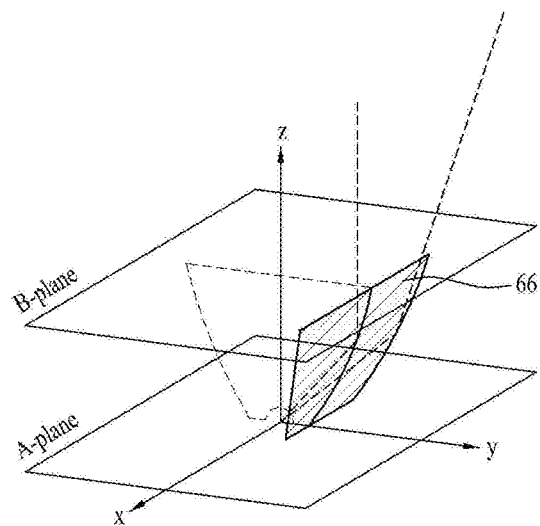
FIG. 8 is a view illustrating light refracted or reflected at one lateral surface of the lens shown in FIG. 1.

FIG. 8 is a view illustrating light refracted or reflected on one lateral surface 66 of the lens 30 shown in FIG. 1.

Referring to FIG. 8, the light radiated from the light emitting device 20 may be refracted (or reflected) by one lateral surface (e.g., 66) of the lateral surface portion 60, and the refracted (or reflected) may be distributed in the direction of the positive x-axis or the negative x-axis.

For example, light leaving the origin (0,0,0) may be refracted (or reflected) by one lateral surface (e.g., 66) of the lateral surface portion 60 positioned in the negative x-axis, and the refracted (or reflected) light may be radiated in the negative x-axis direction and positive z-axis direction (−x, +z).

Figure 9A:
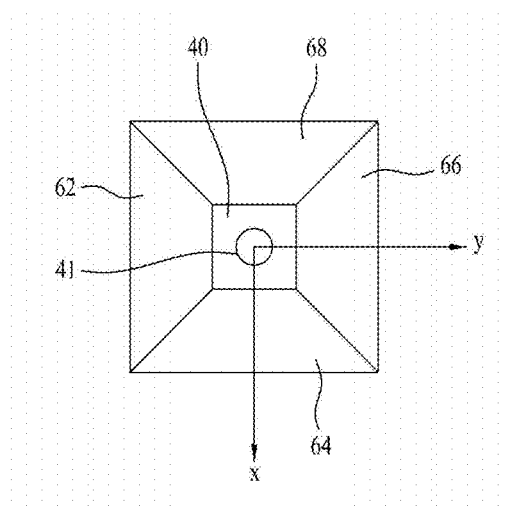
FIG. 9A is a plan view illustrating the lens of FIG. 1 in the xy plane.
Figure 9B:
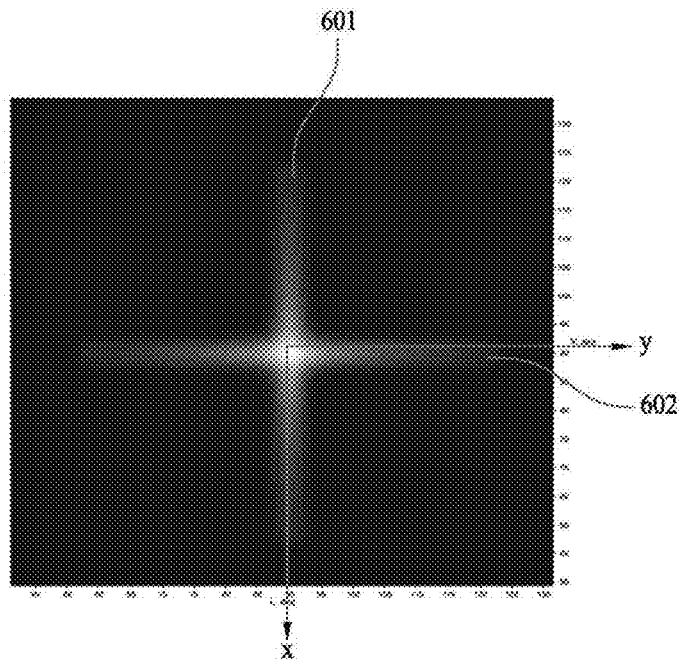
FIG. 9B is a view illustrating distribution of light emitted from the lens shown in FIG. 1.

FIG. 9A is a plan view illustrating the lens 30 of FIG. 1 in the xy plane, and FIG. 9B is a view illustrating distribution of light emitted from the lens 30 shown in FIG. 1.

Referring to FIGS. 9A and 9B, the light refracted (or reflected) by the first lateral surface 62 and third lateral surface 66 of the lateral surface portion 60 facing each other may form a first line 601 in the positive(+) x-axis direction and the negative(−) x-axis direction.

The light refracted (or reflected) by the second lateral surface 64 and fourth lateral surface 68 of the lateral surface portion 60 facing each other may form a second line 602 in the positive(+) y-axis direction and the negative(−) y-axis direction. The first line 601 and the second line 602 may cross each other at a right angle, and distribution of the light by the lens 30 may have a cross-shaped beam pattern.

According to the illustrated embodiment, light distribution having a cross-shaped beam pattern rather than a beam pattern of Lambertian shape may be implemented by the lens 30 including lateral surfaces having the same curvature as that of a parabola. This embodiment may be applied to the illumination apparatus which needs a cross-shaped beam pattern and may be used for a turn indicator, a sidelight, a tail lamp, a stoplight or a daytime running lamp of an automobile.

Figure 10:
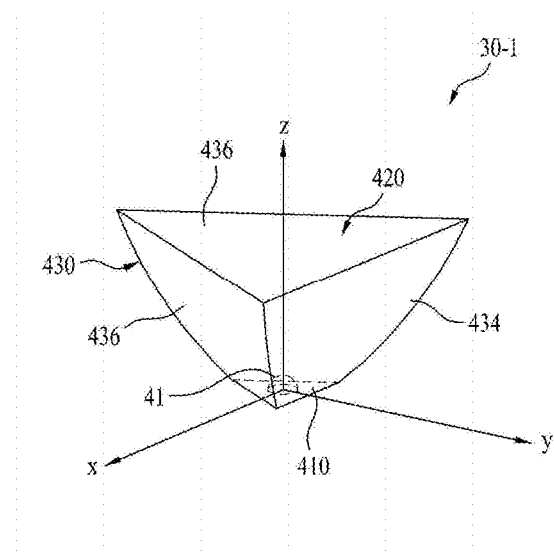
FIG. 10 is a view illustrating a lens according to another embodiment.
Figure 11:
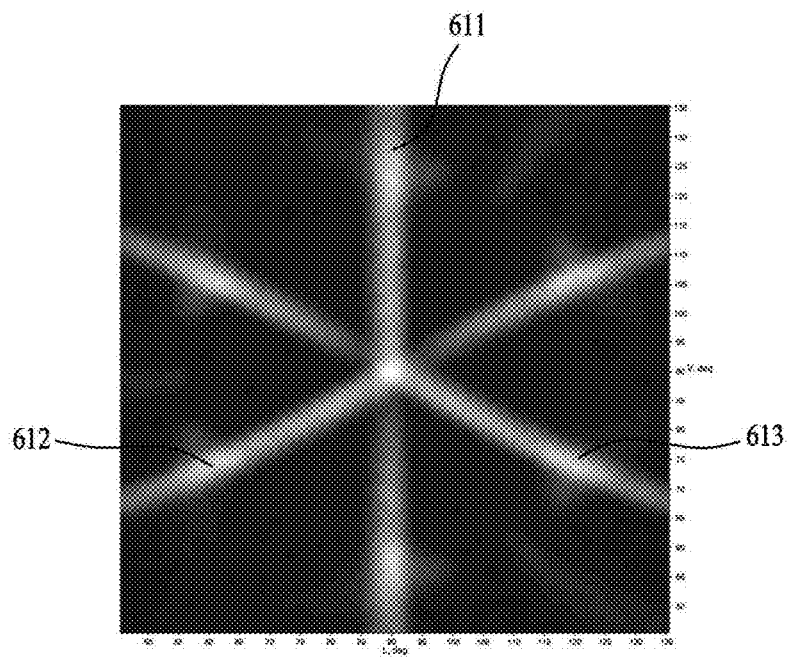
FIG. 11 is a view illustrating a pattern of light distribution by the lens shown in FIG. 10.

FIG. 10 is a view illustrating a lens 30-1 according to another embodiment, and FIG. 11 is a view illustrating a pattern of light distribution by the lens 30-1 shown in FIG. 10.

Referring to FIGS. 10 and 11, the upper surface portion 420 of the lens 30-1 may be a triangle (e.g., an equilateral triangle) including three first sides, and the lower surface portion 410 of the lens 30-1 may be a triangle (e.g., an equilateral triangle) including three second sides.

The lateral surface portion 430 of the lens 30-1 may include three lateral surfaces 432, 434 and 436 positioned between the lower surface portion 410 and the upper surface portion 420 and having the same curvature as that of a parabola.

The lower surface portion 410 may have a light incidence portion 41 upon which the light generated by the light emitting device 20 is incident.

In a cross section of the lens 30-1 arranged in a vertical direction, a curve corresponding to the lateral surface portion 430 may have the same curvature as that of a parabola. Herein, the vertical direction may be a direction perpendicular to the upper surface portion 420 and the lower surface portion 410. For example, when the upper surface portion 420 and the lower surface portion 410 are parallel to the xy plane, the vertical direction may be parallel to the zy plane or the zx plane.

Since each of the upper surface portion 420 and the lower surface portion 410 is a triangle and the lateral surface portion 430 includes the three lateral surfaces 432, 434 and 436 which do not face each other, light distribution by the lens 30-1 may have a pattern of intersection of three lines 611, 612 and 613. For example, in the case that the upper surface portion 420 and the lower surface portion 410 are equilateral triangles, the light distribution may have a pattern in which the three lines 611, 612 and 613 intersect each other at 120°.

Figure 12:
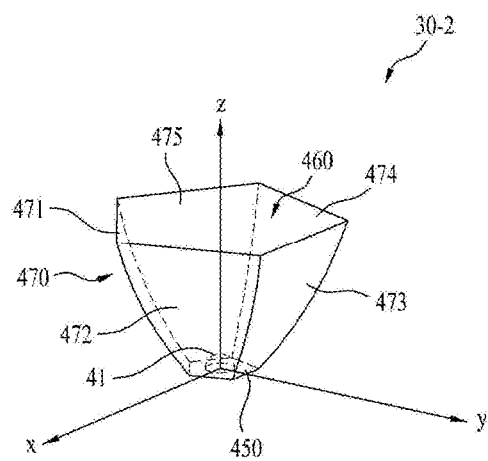
FIG. 12 is a view illustrating a lens according to another embodiment.
Figure 13:
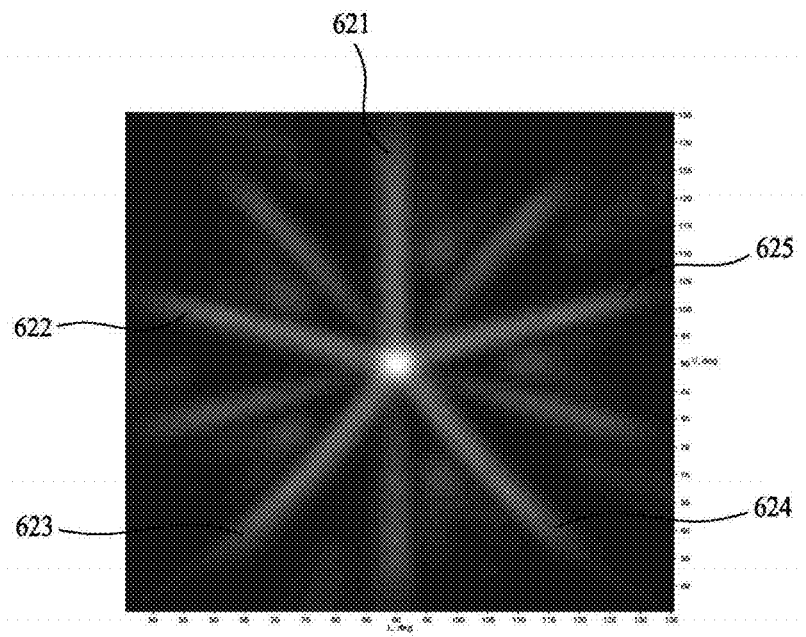
FIG. 13 is a view illustrating a pattern of light distribution by the lens shown in FIG. 12.

FIG. 12 is a view illustrating a lens 30-2 according to another embodiment, and FIG. 13 is a view illustrating a pattern of light distribution by the lens 30-2 shown in FIG. 12.

Referring to FIGS. 12 and 13, the upper surface portion 460 of the lens 30-2 may be a pentagon (e.g. a regular pentagon) including five first sides, and the lower surface portion 450 of the lens 30-2 may be a pentagon (e.g. a regular pentagon) including five second sides.

The lateral surface portion 470 of the lens 30-2 may be positioned between the lower surface portion 450 and the upper surface portion 460, and may include five lateral surfaces 471, 472, 473, 474 and 475 having the same curvature as that of a parabola.

In a cross section of the lens 30-2 arranged in a vertical direction, a curve corresponding to the lateral surface portion 470 may have the same curvature as that of a parabola. Herein, the vertical direction may be a direction perpendicular to the upper surface portion 460 and the lower surface portion 450. For example, when the upper surface portion 460 and the lower surface portion 450 are parallel to the xy plane, the vertical direction may be parallel to the zy plane or the zx plane.

Since each of the upper surface portion 460 and the lower surface portion 450 is a pentagon and the lateral surface portion 470 includes five lateral surfaces 471, 472, 473, 474 and 475 which do not face each other, light distribution by the lens 30-2 may have a pattern of intersection of five lines 621, 622, 623, 624 and 625. For example, in the case that the upper surface portion 460 and the lower surface portion 450 are regular pentagons, the light distribution may have a pattern in which the five lines 621, 622, 623, 624 and 625 intersect each other. And an angle between adjacent two lines in the light distribution pattern may be 72°.

Figure 14:
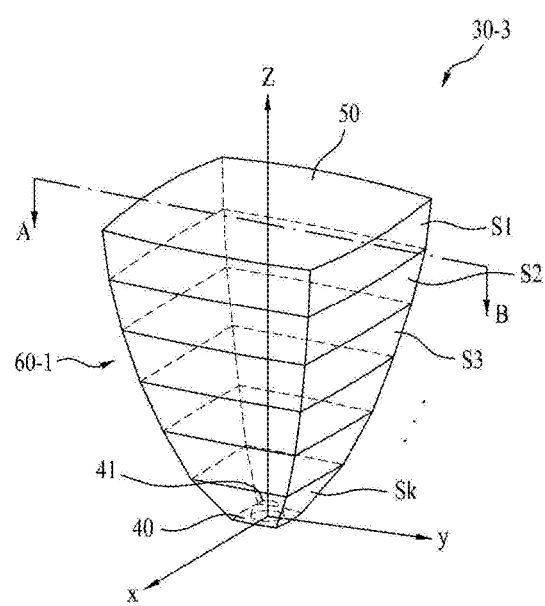
FIG. 14 is a view illustrating a lens according to another embodiment.
Figure 15:
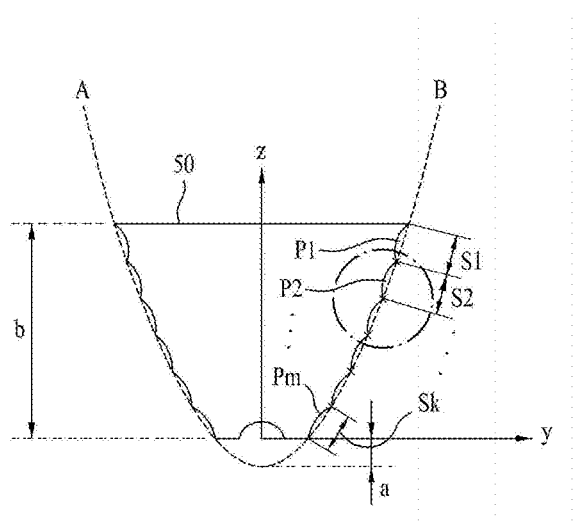
FIG. 15 is a view showing a cross section of the lens of FIG. 14 in the zy plane.
Figure 16:
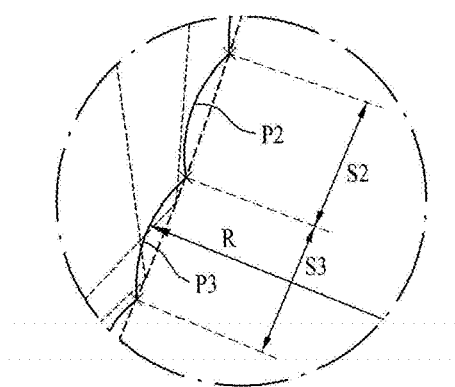
FIG. 16 is an enlarged view illustrating a portion surrounded by a dotted line shown in FIG. 15.

FIG. 14 is a view illustrating a lens 30-3 according to another embodiment, FIG. 15 is a view showing a cross section of the lens 30-3 of FIG. 14 in the zy plane, and FIG. 16 is an enlarged view illustrating a portion surrounded by a dotted line shown in FIG. 15.

Referring to FIGS. 14 and 15, the lens 30-3 is a variation of the lens 30 shown in FIG. 3, a lateral surface portion 60-1 of the lens 30-3 may be basically designed to have the same curvature as that of a parabola, similar to the lateral surface portion 60 shown in FIG. 3. That is, the dotted line in the cross section shown in FIG. 15 may have the same curvature as that of a parabola according to Equation 1, as described above with reference to FIG. 4.

To adjust light distribution in a cross pattern, the lateral surface portion 60-1 may be formed by changing a portion of the structure of the lateral surface portion 60 shown in FIG. 3. For example, to adjust the line width of the cross shape, the lateral surface portion 60-1 may have a recess.

The lens 30-3 may include a lower surface portion 40, an upper surface portion 50, and a lateral surface portion 60-1. The lower surface portion 40 and the upper surface portion 50 may be identical to those illustrated in FIG. 3.

The lateral surface portion 60-1 may include plural, e.g., four lateral surfaces 62, 64, 66 and 68. Each of the lateral surfaces 62, 64, 66 and 68 may include a plurality of regions S1 to Sk (k>1, where k is a natural number). A region adjacent to the upper surface portion 50 may be defined as a first region S1, and a region adjacent to the lower surface portion 40 may be defined as a k-th region Sk (k>1, where k is a natural number).

The first to k-th regions S1 to Sk (k>1, where k is a natural number) may be divided in a column direction. For example, as shown in FIG. 14, the first to k-th regions S1 to Sk (k>1, where k is a natural number) may be divided in the column direction to have the same width, but not divided in a row direction. Herein, the column direction may be a direction extending from the upper surface portion 50 toward the lower surface portion 40, or the z-axis direction, and the row direction may be the y-axis or x-axis direction.

Each of the regions S1 to Sk (k>1, where k is a natural number) included in one of the lateral surfaces 62, 64, 66 and 68 may be parallel with each corresponding region included in another lateral surface and may have the same width as that of each corresponding region included in another lateral surface. In the case that each of the regions S1 to Sk included in one of the lateral surfaces 62, 64, 66 and 68 has the same width as that of each corresponding region included in another lateral surface, a cross-shaped beam pattern with symmetrical line widths may be obtained.

For example, boundary lines between two neighboring ones of the regions S1 to Sk (k>1, where k is a natural number) included in the respective lateral surfaces 62, 64, 66 and 68 may be parallel to each other and positioned in the same plane.

The width of the interval of each of the regions S1 to Sk (k>1, where k is a natural number) may be constant. Alternatively, the width of the interval of at least one of the regions S1 to Sk (k>1, where k is a natural number) may be different from the width of the interval of each of the other regions. Alternatively, the regions S1 to Sk (k>1, where k is a natural number) may have different widths respectively.

For example, the width of each interval may be less than or equal to 5 mm. If the width exceeds 5 mm, the cross shape may be distorted.

At least one of the regions S1 to Sk (k>1, where k is a natural number) may have a recess Pm (m>1, where m is a natural number). For example, at least one of the regions S1 to Sk (k>1, where k is a natural number) may have a recess Pm (m>1, where m is a natural number) with a predetermined curvature R.

For example, the regions S1 to Sk (k>1, where k is a natural number) may have recesses P1 to Pm (m>1, where m is a natural number).

Each of the recesses P1 to Pm (m>1, where m is a natural number) may be formed from one end to the other end of a corresponding one of the regions S1 to Sk (k>1, where k is a natural number), and may have a constant curvature.

When the width of each region is less than or equal to 5 mm, the curvature of each of the recesses P1 to Pm (m>1, where m is a natural number) may be greater than or equal to 0 and less than a first curvature. The first curvature may be a curvature of a circle whose radius is 100 mm. when the curvature is 0, the region may be a line segment. In the case that the width of the interval is less than or equal to 5 mm and the curvature of each of the recesses P1 to Pm (m>1, where m is a natural number) is greater than or equal to the first curvature, the cross shape may be distorted.

The recesses P1 to Pm (m>1, where m is a natural number) may have the same curvature. Alternatively, at least one of the recesses P1 to Pm (m>1, where m is a natural number) may have a curvature different from the curvature of the other recesses. Alternatively, each of the recesses P1 to Pm (m>1, where m is a natural number) may have a different curvature.

Figure 17:
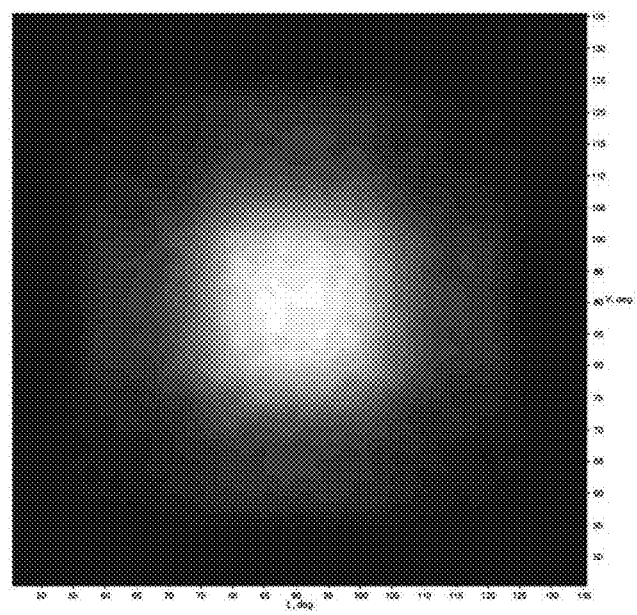
FIG. 17 is a view illustrating a pattern of light distribution implemented by the lens shown in FIG. 14.

FIG. 17 is a view illustrating a pattern of light distribution implemented by the lens 30-3 shown in FIG. 14. Referring to FIG. 17, the line width of the cross shape has been increased from that of the cross shape shown in FIG. 9B. This is because the light radiated from the light emitting device 20 is distributed in the z direction by the recesses P1 to Pm (m>1, where m is a natural number) provided to the lateral surface portion 60-1.

Accordingly, this embodiment may obtain a cross-shaped beam pattern having a line width adjusted by the recesses P1 to Pm (m>1, where m is a natural number) formed at the lateral surface portion 60-1.

Figure 18:
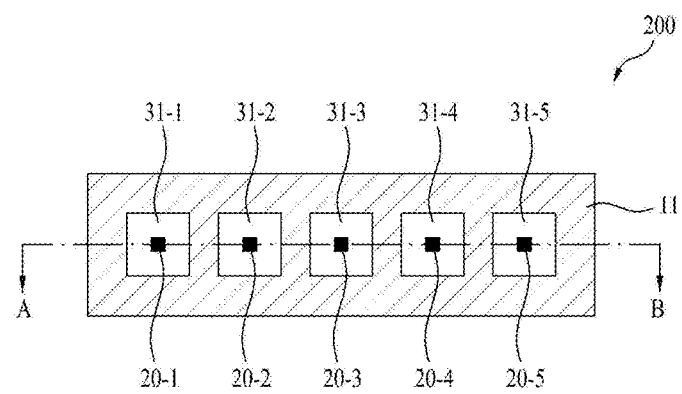
FIG. 18 is a plan view illustrating a light emitting module according to one embodiment.
Figure 19:
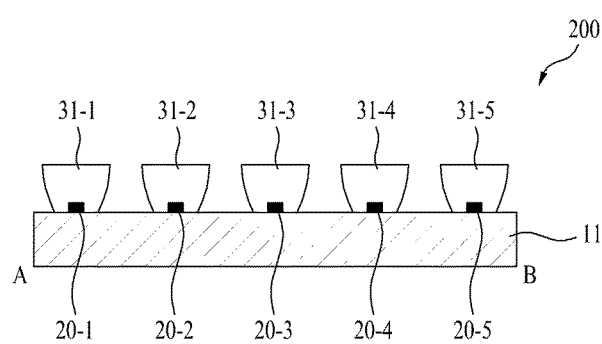
FIG. 19 is a cross-sectional view illustrating the light emitting module shown in FIG. 18, taken along line AB.

FIG. 18 is a plan view illustrating a light emitting module 200 according to one embodiment, and FIG. 19 is a cross-sectional view illustrating the light emitting module 200 shown in FIG. 18, taken along line AB.

Referring to FIGS. 18 and 19, the light emitting module 200 includes a substrate 11, light emitting devices 20-1 to 20-n (n>1, where n is a natural number), and lenses 31-1 to 31-n (n>1, where n is a natural number).

The substrate 11 may be a printed circuit board. The light emitting devices 20-1 to 20-n (n>1, where n is a natural number) may be disposed on the substrate 11 and spaced apart from each other. The light emitting devices 20-1 to 20-n may be fixed to the substrate 11 through eutectic bonding or die bonding. For example, the light emitting devices 20-1 to 20-n (n>1, where n is a natural number) may be light emitting diodes.

Each of the lenses 31-1 to 31-n (n>1, where n is a natural number) may be positioned on a corresponding one of the light emitting devices 20-1 to 20-n (n>1, where n is a natural number). Each of the lenses 31-1 to 31-n, (n>1, where n is a natural number) may be one of the embodiments (30, 30-1, 30-2, 30-3). As described above, the lenses 31-1 to 31-n (n>1, where n is a natural number) may be positioned under the light incidence portion 41 of the lenses 31-1 to 31-n (n>1, where n is a natural number).

For example, the light emitting devices 20-1 to 20-n (n>1, where n is a natural number) may be disposed in line on the substrate 11 so as to be parallel with each other, and the lenses 31-1 to 31-n (n>1, where n is a natural number) may be correspondingly disposed in a line on the substrate 11 so as to be parallel with each other.

The light emitting module 200 according to this embodiment may implement light distribution with a cross-shaped beam pattern as described above.

Figure 20:
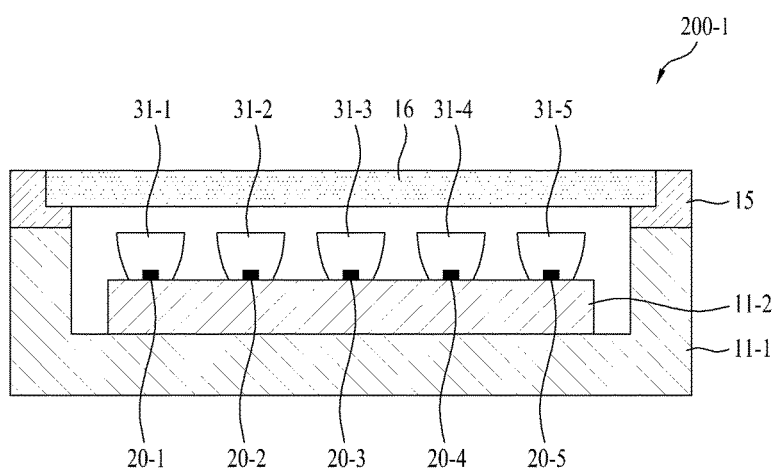
FIG. 20 is a cross-sectional view illustrating a light emitting module according to another embodiment.

FIG. 20 is a cross-sectional view illustrating a light emitting module 200-1 according to another embodiment. Reference numerals of FIG. 20 identical to those of FIG. 19 represent the same constituents, and thus a description thereof will be briefly given or omitted.

Referring to FIG. 20, the light emitting module 200-1 includes a first substrate 11-1, a second substrate 11-2, a plurality of light emitting devices 20-1 to 20-n (n>1, where n is a natural number), a plurality of lenses 31-1 to 31-n (n>1, where n is a natural number), a barrier 15, and a cover glass 16.

The second substrate 11-2 may be disposed on the first substrate 11-1, the light emitting devices 20-1 to 20-n, (n>1, where n is a natural number) may be disposed on the second substrate 11-2.

Each of the lenses 31-1 to 31-n (n>1, where n is a natural number) may be disposed on the first substrate 11-1 so as to surround a corresponding one of the light emitting devices 20-1 to 20-n (n>1, where n is a natural number), and may refract (or reflect) the light radiated from the corresponding one of the light emitting devices.

The first substrate 11-1 may have a cavity 13, the second substrate 11-2 may be disposed in the cavity 13 of the first substrate 11-1.

The barrier 15 may be disposed at the edge of the first substrate 11-1 around the cavity 13. The barrier 15 may protect a wire (not shown) electrically connected to the light emitting devices 20-1 to 20-n (n>1, where n is a natural number) and may support the cover glass 16. The barrier 15 may have a polygonal or ring shape. However, embodiments are not limited thereto.

The barrier 15 may reflect the light radiated from the light emitting devices 20-1 to 20-n (n>1, where n is a natural number), thereby increasing the efficiency of light extraction. The barrier 15 may be formed of a reflective member, for example, a material containing at least one of aluminum (Al), silver (Ag), platinum (Pt), rhodium (Rh), radium (Rd), palladium (Pd), and chromium (Cr).

The cover glass 16 may be disposed on the barrier 15 such that it is spaced a certain distance from the light emitting devices 20-1 to 20-n (n>1, where n is a natural number). The cover glass 16 may protect the light emitting devices 20-1 to 20-n (n>1, where n is a natural number) and allow the light generated by the light emitting devices 20-1 to 20-n (n>1, where n is a natural number) to be transmitted therethrough.

To improve transmissivity, the cover glass 16 may include an anti-reflective coating film. The cover glass 16 may be formed by attaching the anti-reflective coating film to a base of glass, or by conducting spin coating or spray coating with an anti-reflective coating agent. For example, the anti-reflective coating film may include at least one of $TiO_2$, $SiO_2$, $Al_2O_3$, $Ta_2O_3$, $ZrO_2$ and $MgF_2$.

The cover glass 16 may include a hole (not shown) or an opening (not shown) allowing gas produced due to heat generated in the light emitting devices 20-1 to 20-n (n>1, where n is a natural number) to be discharged therethrough.

The cover glass 16 may include a filter (not shown) allowing only a light of a specific wavelength to pass therethrough, or a shading or reflective pattern (not shown) to adjust the beam angle of the light. According to another embodiment, the cover glass may have the shape of a dome with a hole or opening. The cover glass 16 may be supported by a part of the upper surface of the barrier 15.

Figure 21:
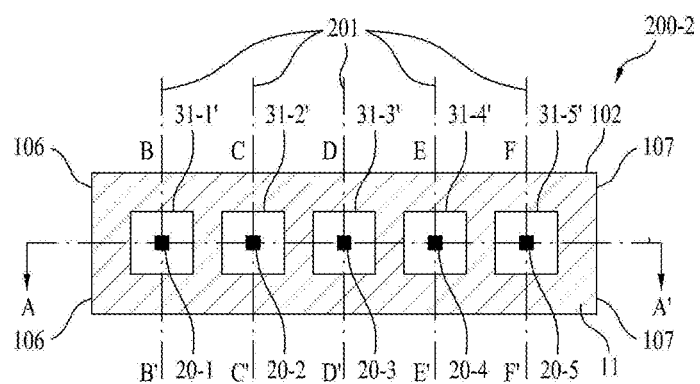
FIG. 21 is a plan view illustrating a light emitting module according to another embodiment.
Figure 22:
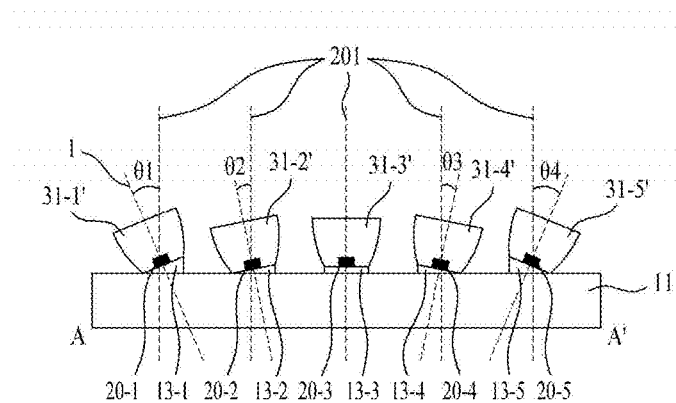
FIG. 22 is a longitudinal cross-sectional view illustrating the light emitting module shown in FIG. 21.
Figure 23:
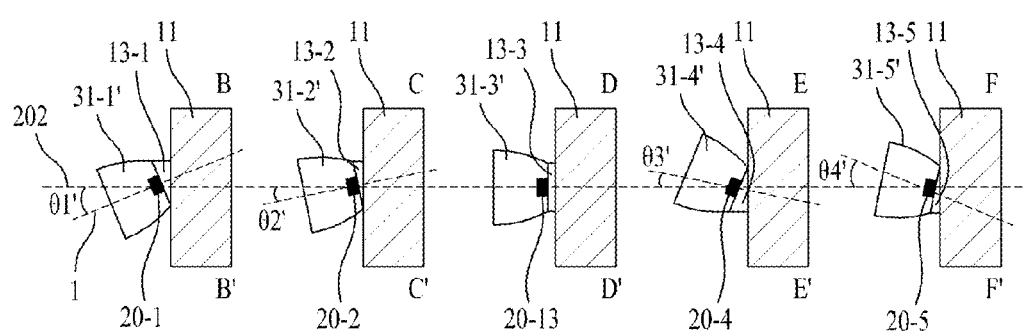
FIG. 23 is a transverse cross-sectional view illustrating the light emitting module shown in FIG. 21.

FIG. 21 is a plan view illustrating a light emitting module 200-2 according to another embodiment, FIG. 22 is a longitudinal cross-sectional view illustrating the light emitting module 200-2 shown in FIG. 21, and FIG. 23 is a transverse cross-sectional view illustrating the light emitting module 200-2 shown in FIG. 21. Herein, the longitudinal cross-sectional view may be taken along line AA', and the transverse cross-sectional view may be taken along lines BB', CC', DD', EE', and FF'.

Referring to FIGS. 21 to 23, the light emitting module 200-2 may include a substrate 11, a plurality of light emitting devices 20-1 to 20-n (n>1, where n is a natural number), and a plurality of lenses 31-1' to 31-n' (n>1, where n is a natural number).

The light emitting module 200-2, which is a variation of the light emitting module 200-2 shown in FIG. 18, may be provided with a light distribution pattern including multiple overlapping cross shapes by changing disposition or position of the light emitting devices 20-1 to 20-n (n>1, where n is a natural number) and the lenses 31-1° to 31-n° (n>1, where n is a natural number).

The light emitting module 200-20 shown in FIG. 21 includes the lens 30 shown in FIG. 3. However, embodiments are not limited thereto. The lenses 31-1' to 31-n' (n>1, where n is a natural number) may be one of the illustrated embodiments (30, 30-1 and 30-2).

The lenses 31-1' to 31-n' (n>1, where n is a natural number) may be inclined at different angles with respect to a reference plane perpendicular to the upper surfaces of the substrate 11 (a "perpendicular plane of the substrate 11").

As shown in FIG. 22, at least one of first angles $\theta 1$ to $\theta n$ (n>1, where n is a natural number) is different from the rest of the first angles $\theta 1$ to $\theta n$.

For example, the lenses 31-1' to 31-n' (n>1, where n is a natural number) are inclined at first angles $\theta 1$ to $\theta n$ (n>1, where n is a natural number), which are different from each other, with respect to the first reference plane 201 perpendicular to the upper surface of the substrate 11. Herein, the first angles may be the angles at which the central axes 1 of the lenses 31-1' to 31-n' (n>1, where n is a natural number) are inclined with respect to the first reference plane 201.

For example, the first angle of a first lens (e.g., 31-3') positioned in the middle of the lenses 31-1' to 31-n' (n>1, where n is a natural number) arranged in line may be 0°, and the first angles (e.g., θ1 and θ4, and θ2 and θ3) of the lenses (e.g., 31-1', 31-2', 31-4', and 31-5') positioned on the left and right sides of the first lens (e.g., 31-3') may be symmetrical to each other.

For example, the first angles (e.g., θ1 and θ4, θ2 and θ3) of the lenses (e.g., 31-1', 31-2', 31-4' and 31-5') except the first lens (e.g., 31-3') may increase as the distances of the lenses (e.g., 31-1', 31-2', 31-4' and 31-5') from the first lens (e.g., 31-3') increases to the left and right sides of the first lens.

In addition, the lenses 31-1' and 31-2' positioned on the left side of the first lens (e.g., 31-3') and the lenses 31-4' and 31-5' positioned on the right side of the first lens (e.g., 31-3') may be inclined with respect to the first reference plane 201 in opposite directions.

In addition, as shown in FIG. 23, at least one of second angles θ1' to θn' (n>1, where n is a natural number) is different from the rest of the second angles θ1' to θn'.

For example, the second angles θ1' to θn' (n>1, where n is a natural number) at which the respective lenses 31-1' to 31-n' (n>1, where n is a natural number) are inclined with respect to a second reference plane 202 which is perpendicular to the upper surface of the substrate 11 and the first reference plane 201 may be different from each other. Herein, the second angles may be angles at which the central axes 1 of the lenses 31-1' to 31-n' (n>1, where n is a natural number) are inclined with respect to the second reference plane 202.

For example, the second angle of a first lens (e.g., 31-3') positioned in the middle of the lenses 31-1' to 31-n' (n>1, where n is a natural number) arranged in line may be 0°, and the second angles (e.g., θ1' and θ4, and θ2' and θ3') of the lenses (e.g., 31-1', 31-2', 31-4', and 31-5') positioned on the left and right sides of the first lens (e.g., 31-3') may be symmetrical to each other.

For example, the second angle of the first lens (e.g., 31-3') may be 0°, and the second angles (e.g., θ1' and θ4', θ2' and θ3') of the lenses (e.g., 31-1', 31-2', 31-4' and 31-5') except the first lens (e.g., 31-3') may increase as the distances of the lenses (e.g., 31-1', 31-2', 31-4' and 31-5') from the first lens (e.g., 31-3') increase to the left and right sides of the first lens.

The lenses 31-1' and 31-2' positioned on the left side of the first lens (e.g., 31-3') and the lenses 31-4' and 31-5' positioned on the right side of the first lens (e.g., 31-3') may be inclined with respect to the second reference plane 202 in opposite directions.

In the xyz coordinate system, when the substrate 11 is parallel with the xy plane, the first reference plane 201 may be a plane parallel to the zx plane, and the second reference plane 202 may be a plane parallel to the yz plane.

The substrate 11 may have inclined portions 13-1 to 13-n (n>1, where n is a natural number) respectively corresponding to the lenses 31-1' to 31-n' (n>1, where n is a natural number).

Each of the lenses 31-1' to 31-n' (n>1, where n is a natural number) may be disposed on the upper surface of a corresponding one of the inclined portions 13-1 to 13-n (n>1, where n is a natural number). Each of the light emitting devices 20-1 to 20-n (n>1, where n is a natural number) may be disposed in one region of the upper surface of an inclined portion positioned under the light incidence portion 41 of a corresponding one of the lenses 31-1' to 31-n' (n>1, where n is a natural number).

To incline the lenses 31-1' to 31-n' (n>1, where n is a natural number) at different angles, the angles at which the inclined portions 13-1 to 13-n (n>1, where n is a natural number) are inclined with respect to at least one of the first reference plane 201 and the second reference plane 202 may be different from each other.

For example, the first angles at which the inclined portions 13-1 to 13-n (n>1, where n is a natural number) are inclined with respect to the first reference plane 201 may be different from each other, and the second angles at which the inclined portions 13-1 to 13-n (n>1, where n is a natural number) are inclined with respect to the second reference plane 202 may be different from each other.

Figure 24:
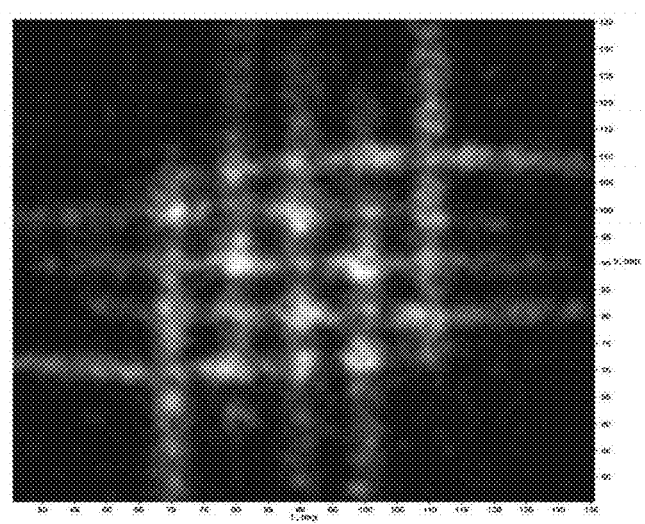
FIG. 24 is a view illustrating a pattern of light distribution by the lenses shown in FIG. 21.

FIG. 24 is a view illustrating a pattern of light distribution by the lenses 31-1' to 31-5' shown in FIG. 21.

Referring to FIG. 24, light distribution by the five lenses 31-1' to 31-5' may be provided with a lattice pattern produced by partial overlapping of cross shapes.

Figure 25:
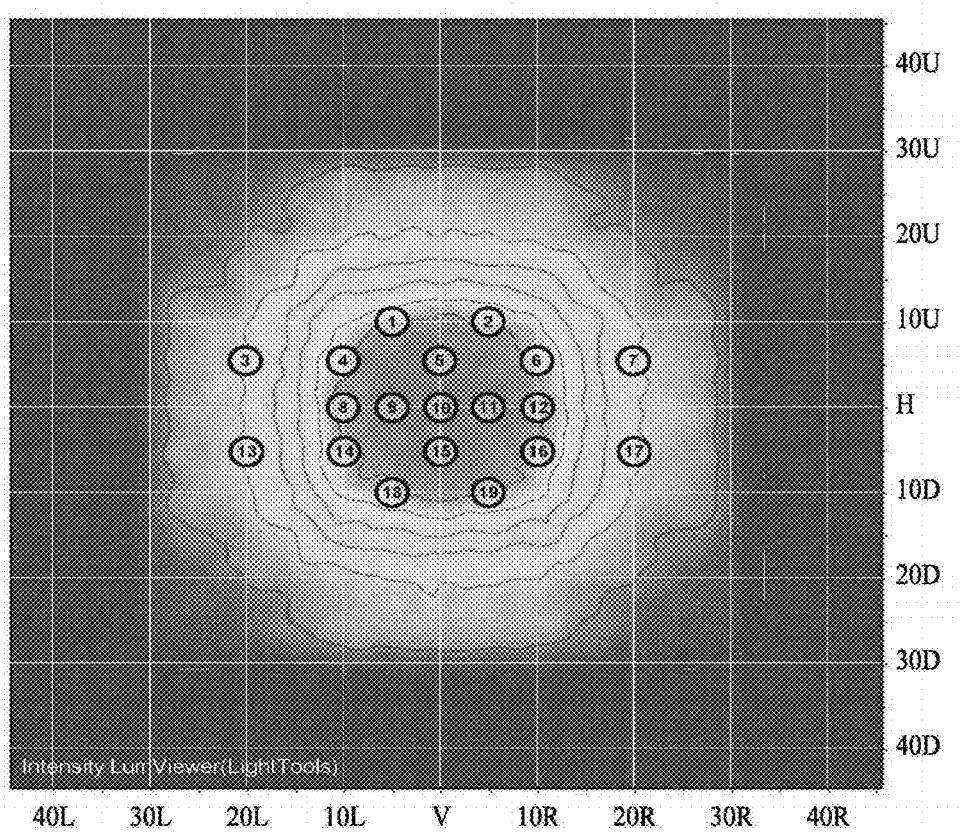
FIG. 25 is a view showing measurement points for light intensity values required for a turn indicator as prescribed in the Korean Motor Vehicle Safety Standards.

FIG. 25 is a view showing measurement points for light intensity values required for a turn indicator as prescribed in the Korean Motor Vehicle Safety Standards.

Referring to FIG. 25 showing measurement of light distribution, a required light intensity at each of the measurement points 1 to 19 is set according to the Korean Motor Vehicle Safety Standards. According to the Korean Motor Vehicle Safety Standards regarding light intensities, strong light intensity is needed within 10° to the upper, lower, left and right sides of the center of a reference plane for measurement, and the light intensity should gradually decrease outside this range up to 20°. The measurement points according to the regulation about light intensities show rectangular distribution of light intensities. The sidelight, tail lamp, stop lamp and daytime running lamp also show distribution of light intensity similar to that of the turn indicator.

FIG. 26 is a view showing light intensity values at measurement points 1 to 19 of a single light source of a light emitting module including the lens 30-3 shown in FIG. 14. Herein, the single light source may include one light emitting device (e.g., 20-1) and one lens 30-3.

Light distribution by the lens 30-3 shown in FIG. 14 is shown in FIG. 17. It can be seen that this distribution is similar to the light distribution of the turn indicator of an automobile as shown in FIG. 23.

FIG. 24 shows light intensity values measured at measurement points 1 to 19 shown in FIG. 23 for the cross-shaped light distribution pattern according to the embodiment illustrated in FIG. 17.

Referring to FIG. 26, it can be seen that the light intensity values measured at the respective measurement points exceed the required light intensities for the measurement points 1 to 19 as prescribed in the Korean Motor Vehicle Safety Standards.

Therefore, the light emitting module according to the illustrated embodiment satisfies the Korean Motor Vehicle Safety Standards, and thus may be used as a light source of the turn indicator of an automobile. In addition, the light emitting module 200 may be used as a light source of a sidelight, tail lamp, stoplight and daytime running lamp of an automobile.

A plurality of light emitting device packages according to one embodiment may be arrayed on a substrate. Optical members such as a light guide plate, a prismسheet and a diffusion sheet may be disposed in the path of light in the light emitting device packages. The light emitting device packages, the substrate and the optical members may function as a backlight unit.

According to another embodiment, the light emitting devices or the light emitting device packages as described above may be included in a display apparatus an indication apparatus, and an illumination system. For example, an illumination system may include a lamp and a street lamp.

Figure 27:
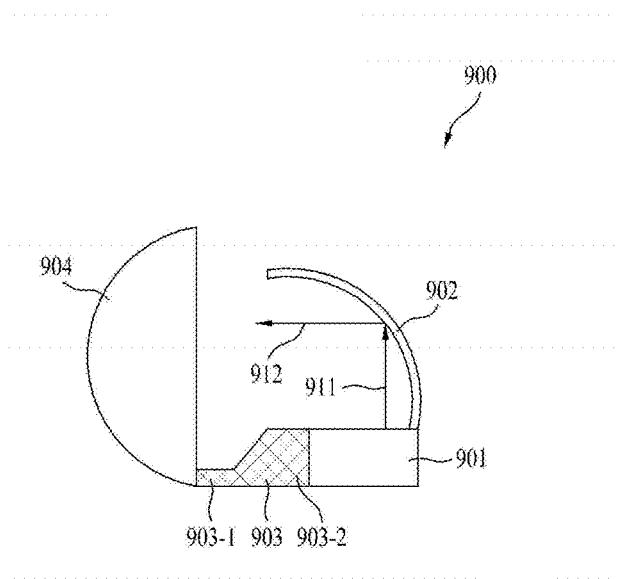
FIG. 27 is a view illustrating a head lamp according to one embodiment.

FIG. 27 is a view illustrating a head lamp 900 according to one embodiment.

Referring to FIG. 27, the head lamp 900 may include a light emitting module 901, a reflector 902, a shade 903, and a lens 904.

The light emitting module 901 may be one of the embodiments (200, 200-1 and 200-2.

The reflector 902 may reflect the light 911 radiated from the light emitting module 901 in a certain direction, e.g., the forward direction 912.

The shade 903 may be disposed between the reflector 902 and the lens 904. The shape 903 is a member to block or reflect part of the light reflected by the reflector 902 and directed to the lens 904 to produce a light distribution pattern desired by the designer. One side 903-1 of the shade 903 may have a different height than the other side 903-2.

The light radiated from the light emitting module 901 is reflected on the reflector 902 and the shade 903, transmitted through the lens 904, and then directed forward of the vehicle body. The lens 904 may refract the light reflected by the reflector 902 forward.

Figure 28:
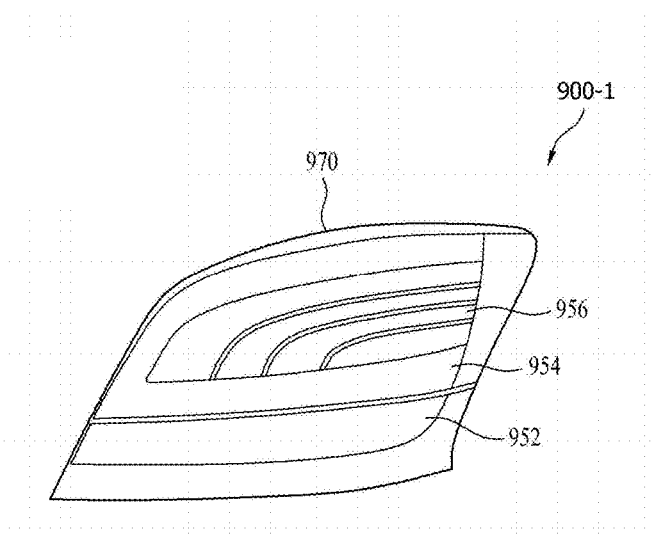
FIG. 28 is a view illustrating a tail lamp for a vehicle according to one embodiment.

FIG. 28 is a view illustrating a tail lamp 900-1 for a vehicle according to one embodiment.

Referring to FIG. 28, the tail lamp 900-1 may include a first light source module 952, a second light source module 954, a third light source module 956, and a housing 970.

The first light source module 952 may be a light source serving as a turn indicator, the second light source module 954 may be a light source serving as a sidelight, and the third light source module 956 may be a light source serving as a stoplight. However, embodiments are not limited thereto. The roles of the modules are interchangeable.

The housing 970 may accommodate the first to third light source modules 952, 954 and 956 and be formed of a light-transmissive material. The housing 970 may have a curved portion according to design of the vehicle body. At least one of the first to third light source modules 952, 954 and 956 may be provided with one of the illustrated embodiments (200, 200-1 and 200-2).

As is apparent from the above description, according to embodiments, light distribution having a cross-shaped beam pattern may be implemented Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a body;
a light emitting device on the body; and
a lens disposed on the light emitting device,
wherein the lens comprises:
a lower surface portion;
an upper surface portion parallel to the lower surface portion; and
a lateral surface portion positioned between the lower surface portion and the upper surface portion,
wherein the lateral surface portion has a plurality of lateral surfaces,
wherein the plurality of lateral surfaces is formed in a shape of a parabola, and
wherein each of the lateral surfaces comprises:
first to k-th regions divided in a column direction; and
a recess having a predetermined curvature in at least one of the first to k-th regions,
wherein the first region is adjacent to the upper surface portion and the k-th region is adjacent to the lower surface portion, and
wherein the column direction is directed from the upper surface portion to the lower surface portion.

2. The light emitting device package according to claim 1, wherein an imaginary extension line connecting lateral surfaces of the plurality of lateral surfaces facing each other has a parabolic shape.

3. The light emitting device package according to claim 1, wherein, in a cross section of the lens arranged in a vertical direction, a curve corresponding to the lateral surface portion has a parabolic shape, and
wherein the vertical direction is a direction perpendicular to the upper surface portion and the lower surface portion.

4. The light emitting device package according to claim 1, wherein the lower surface portion is positioned in an xy plane in a xyz coordinate system, and a center of the lower surface portion is positioned at an origin of the xyz coordinate system, and
wherein a focal length of a parabola of the lateral surface portion is less than or equal to 5 mm.

5. The light emitting device package according to claim 4, wherein a distance between the lower surface portion and the upper surface portion is greater than or equal to 10 mm and less than or equal to 50 mm.

6. The light emitting device package according to claim 1,
wherein the upper surface portion is a polygon comprising a plurality of first sides,
wherein the lower surface portion is a polygon comprising second sides corresponding to the first sides, and
wherein one of the lateral surfaces is positioned between a corresponding one of the first sides and a corresponding one of the second sides.

7. The light emitting device package according to claim 6, wherein an area of the upper surface portion is greater than an area of the lower surface portion.

8. The light emitting device package according to claim 6, wherein the upper surface portion and the lower surface portion are quadrangles, the lateral surface portion comprises four lateral surfaces, and the light emitted from the lens has a cross shape.

9. The light emitting device package according to claim 1, wherein the lower surface portion of the lens is positioned in an xy plane, and a center of the lower surface portion is positioned at an origin,
wherein, in a cross section of the lens, a curve corresponding to the lateral surface portion has a parabolic shape according to Equation 1, and the cross section of the lens is parallel to a zy plane and passes through the origin:

$$y^2 = 4a(z+a), \qquad \text{Equation 1}$$

and
wherein a in equation 1 is a focal length of the parabola, and the focus of the parabola is positioned at the origin of the zy plane.

10. The light emitting device package according to claim 1, wherein the lower surface portion comprises a light incidence portion having a semi-spherical shape and receiving incident light from the light emitting devices.

11. A light emitting device package comprising:
a body;
a light emitting device disposed on the body; and
a lens disposed on the light emitting device,
wherein the lens comprises:
a lower surface portion;
an upper surface portion parallel to the lower surface portion; and
a lateral surface portion positioned between the lower surface portion and the upper surface portion, the lateral surface portion comprising a plurality of lateral surfaces,
wherein each of the lateral surfaces has a parabolic shape and has a plurality of regions divided in a column direction, and
wherein at least one of the regions comprises a recess having a predetermined curvature, and the column direction is directed from the upper surface portion to the lower surface portion.

12. The light emitting device package according to claim 11, wherein intervals of the regions included in each of the lateral surfaces have the same width.

13. The light emitting device package according to claim 11, wherein an interval of at least one of the regions included in each of the lateral surfaces has a different width than the intervals of the other regions.

14. The light emitting device package according to claim 11, wherein a width of an interval of each of the regions included in each of the lateral surfaces is less than or equal to 5 mm.

15. The light emitting device package according to claim 11, wherein the recess has a constant curvature from one end of at least one region of the regions to the other end of the at least one region.

16. The light emitting device package according to claim 11, wherein the upper surface portion and the lower surface portion are quadrangles, and the lateral surface portion comprises four lateral surfaces,
wherein each of the lateral surfaces comprises a plurality of regions, each of the regions comprising the recess, and
wherein the recess has a constant curvature from one end of each of the regions to the other end of each of the regions.

17. An illumination apparatus comprising:
a substrate;
a plurality of light emitting devices disposed on the substrate; and
a plurality of lenses disposed to correspond to the light emitting devices respectively,
wherein each of the lenses comprises:
a lower surface portion;
an upper surface portion parallel to the lower surface portion; and
a lateral surface portion positioned between the lower surface portion and the upper surface portion and provided with a plurality of lateral surfaces, the plurality of lateral surfaces having a curvature equal to a curvature of a parabola,
wherein the lenses are arranged in one line from one end of the substrate to the other end of the substrate, and
wherein a first angle of at least one of the lenses is different from first angles of the other lenses, the first angle being an inclination angle of a central axis of each of the lenses with respect to a first reference plane perpendicular to an upper surface of the substrate.

18. The illumination apparatus according to claim 17, wherein the first angle of a first lens disposed in the middle of the lenses is 0°, and the first angles of the other lenses increase as a distance from the first lens to left and right sides increases, and the lenses positioned on the left side of the first lens and the lenses positioned on the right side of the first lens are inclined with respect to the first reference plane in opposite directions.

19. The illumination apparatus according to claim 18, wherein a second angle of at least one of the lenses is different from second angles of the other lenses, the second angle being an inclination angle of the central axis of each of the lenses with respect to a second reference plane perpendicular to an upper surface of the substrate and the first reference plane.

20. The illumination apparatus according to claim 19, wherein the second angle of the first lens disposed in the middle of the lenses is 0°, and the second angles of the other lenses increase as the distance from the first lens to the left and right sides increases, and the lenses positioned on the left side of the first lens and the lenses positioned on the right side of the first lens are inclined with respect to the second reference plane in opposite directions.

* * * * *